United States Patent [19]
Yoshida

[11] Patent Number: 5,764,048
[45] Date of Patent: Jun. 9, 1998

[54] ULTRA HIGH ACCURACY VOLTAGE MEASUREMENT SYSTEM

[75] Inventor: Haruo Yoshida, Gyoda, Japan

[73] Assignee: Advantest Corp., Tokyo, Japan

[21] Appl. No.: 637,053

[22] Filed: Apr. 24, 1996

[30] Foreign Application Priority Data

Apr. 24, 1995 [JP] Japan .................. 7-123170

[51] Int. Cl.⁶ .................. G01R 19/18; G01R 17/06
[52] U.S. Cl. .................. 324/120; 324/99 D
[58] Field of Search .................. 324/207, 99 D, 324/158.1, 121 R, 120, 74; 331/107

[56] References Cited

U.S. PATENT DOCUMENTS

| | | | |
|---|---|---|---|
| 3,761,798 | 9/1973 | Silver | 324/120 |
| 4,468,635 | 8/1984 | Lukens et al. | 331/107 |
| 4,605,897 | 8/1986 | Gelinas | 324/207 |
| 4,866,373 | 9/1989 | Harada et al. | 324/120 |

Primary Examiner—Ernest F. Karlsen
Assistant Examiner—Anh Phung
Attorney, Agent, or Firm—Muramats & Associates

[57] ABSTRACT

An ultra high accuracy voltage measurement system utilizes a Josephson junction voltage generator whose voltage is controlled by a high precision frequency. The voltage measurement system to measure an input DC voltage incudes: a microwave oscillator which generates a microwave signal whose frequency is variable by a voltage applied thereto; an atomic frequency standard which generates a standard frequency signal with extremely high accuracy and stability; a frequency synthesizer which synthesizes a frequency signal based on the atomic frequency standard; a phase lock loop for synchronizing the microwave signal with the frequency signal from the frequency synthesizer; a Josephson junction voltage generator which is soaked with liquid helium and generates a standard voltage determined by the frequency and a power level of the microwave signal; a bias circuit for supplying a bias current to the Josephson junction voltage generator; a switch group for alternately changing polarities of the input voltage and the standard voltage; a difference detector for detecting a voltage difference between the input voltage and the standard voltage; a feedback circuit to control the frequency of the microwave signal through the phase lock loop so that the voltage difference is canceled; and a system controller to control an overall operation of the voltage measurement system.

23 Claims, 3 Drawing Sheets

ULTRA HIGH ACCURACY VOLTAGE MEASUREMENT SYSTEM

FIELD OF THE INVENTION

This invention relates to a voltage measurement system for accurately measuring an input voltage of a device to be measured, and more particularly, to an ultra high accuracy and precision voltage measurement system which can measure voltages of a high precision standard cell or zener diodes with an extremely high accuracy.

BACKGROUND OF THE INVENTION

FIG. 4 shows a fundamental configuration for measuring a voltage in the conventional method. A voltage measuring instrument 11 is connected to a voltage source 10 such as a battery or a voltage generator to measure a DC voltage. Today, there are various types of voltage measuring instruments such as an analog voltage meter (voltmeter) or a digital voltage meter (voltmeter). An analog voltmeter indicates the measured voltage by, for example, a position of a needle like pointer while a digital voltmeter indicates the measured voltage by digit numbers. Because the analog voltmeter has a poor measuring resolution and is subject to individuals' reading errors, digital voltmeters have been predominantly used today for measuring the voltages in almost all occasions.

There are variety of operational principles in digital voltmeters such as a dual-slope type, a double slope type or a flash A/D type although each of which will not be explained here. The digital voltmeters use zener diodes as voltage references and in case where further measuring precision is necessary, an external standard cell is used to calibrate the reference voltages represented by the zener diodes. At all events, a voltage is measured by comparing the input voltage with the reference voltage produced by the zener diode in the digital voltmeter. Therefore, the measuring accuracy will be determined by the accuracy of the reference voltage of the digital voltmeter.

For example, in a brochure of a digital voltmeter having a seven-and-half-digit display range, which is one of the highest end digital voltmeters, a provider of the digital voltmeter guarantees a measurement accuracy of ±0.007%+ 300 in a 200 mV range where the measuring resolution is 10 nV. This means that although the voltmeter's voltage resolution is 10 nV, the measuring accuracy, i.e., a difference from the national standard may be ±3 microvolt or less. This accuracy is determined by the traceability of the reference voltage (such as zener diode) in the digital voltmeter with the national voltage standard. Typically, the voltage measurement accuracy of ±3 microvolt or ±3 ppm (parts per million) is the possible maximum guarantee level in the digital voltmeter.

As in the foregoing, in the conventional digital voltmeter or other voltage measuring technique, it is not possible to measure the voltage with enough accuracy and resolution. Thus, for measuring a high precision zener diode or a standard voltage cell, there is a need of an ultra high accuracy and resolution voltage measurement system. Such a precision measurement requires a voltage measurement accuracy of 10 nV, i.e., two digits or even three digits greater than the conventionally possible accuracy level.

SUMMARY OF THE INVENTION

It is therefore an object of the present invention to provide an ultra high accuracy and resolution voltage measurement system which is capable of measuring the voltage with an extremely high accuracy equivalent to the accuracy level of the national voltage standard.

It is another object of the preset invention to provide an ultra high accuracy and resolution voltage measurement system which is capable of dramatically improving the measuring accuracy by more than two digits better than the conventional technology.

It is a further object of the present invention to provide an ultra high accuracy and resolution voltage measurement system which is capable of measuring the voltage with an extremely high accuracy without being subject to a measuring conditions such as a measuring time, place or measuring person.

It is a further object of the present invention to provide an ultra high accuracy and resolution voltage measurement system which is capable of measuring the voltage with high accuracy with the arrangement of relatively low cost.

In order to achieve the above objectives, the first aspect of the present invention incorporates a Josephson junction voltage generator. The output voltage of the Josephson junction is compared with a voltage of the DUT by a balance detector. A correction frequency corresponding to the difference voltage from the balance detector is feedbacked to the Josephson junction voltage generator by controlling a microwave frequency supplied to the Josephson junction. Thus, the output voltage of the Josephson junction voltage generator is ultimately controlled to be equal to the voltage of the DUT so that the reading of the Josephson junction voltage generator gives the accurate measurement voltage of the DUT.

In the first aspect of the present invention, the voltage measurement system to measure an input DC voltage incudes: a microwave oscillator which generates a microwave signal wherein the frequency of the microwave signal is variable by a voltage applied thereto; an atomic frequency standard which generates a standard frequency signal with extremely high accuracy and stability; a frequency synthesizer which synthesizes a frequency signal based on the standard frequency signal from the atomic frequency standard; a phase lock loop for synchronizing a phase of the microwave signal with a phase of the frequency signal from the frequency synthesizer; a Josephson junction voltage generator which is soaked with liquid helium and generates a standard voltage determined by the frequency and a power level of the microwave signal generated by the microwave oscillator; a bias circuit for supplying a bias current to the Josephson junction voltage generator; a switch group for alternately changing polarities of the input voltage to be measured and the standard voltage generated by the Josephson junction voltage generator; a difference detector for detecting a voltage difference between the input voltage and the standard voltage; a feedback circuit to feedback a frequency to be added to or subtracted from the frequency signal generated by the frequency synthesizer to control the frequency of the microwave signal through the phase lock loop so that the voltage difference between the input voltage and the standard voltage is canceled; and a system controller to control an overall operation of the voltage measurement system.

Since the Josephson junction voltage generator is an expensive device, in the second aspect of the present invention, a frequency controlled voltage generator, which is available with a relatively low cost, is used as a precision voltage source. The frequency controlled voltage generator uses a resonator made of a piezoelectric element. Similar to the first aspect of the present invention, the frequency controlled voltage generator is controlled its frequency so that the output voltage becomes equal to the voltage of the DUT. Thus, the reading of the control voltage supplied to the frequency controlled voltage generator gives the accurate measurement voltage of the DUT.

In the second aspect of the present invention, the voltage measurement system to measure an input DC voltage incudes: a voltage controlled oscillator which has a piezoelectric element as a resonator and generates a high frequency signal the frequency of which is variable by a voltage applied thereto; an atomic frequency standard which generates a standard frequency signal with extremely high accuracy and stability; a frequency synthesizer which synthesizes a frequency signal based on the standard frequency signal from the atomic frequency standard; a phase lock loop for synchronizing a phase of the high frequency signal from the voltage controlled oscillator with a phase of the frequency signal from the frequency synthesizer; means for taking a control voltage supplied to the voltage controlled oscillator in the phase lock loop and applying the control voltage as a standard voltage; a switch group for alternately changing polarities of the input voltage to be measured and the standard voltage generated by the phase lock loop; a difference detector for detecting a voltage difference between the input voltage and the standard voltage; a feedback circuit to feedback a frequency to be added to or subtracted from the frequency signal generated by the frequency synthesizer to control the frequency of the high frequency signal through the phase lock loop so that the voltage difference between the input voltage and the standard voltage is canceled; and a system controller to control an overall operation of the voltage measurement system.

According to the present invention, the ultra high accuracy and resolution voltage measurement system is capable of measuring the voltage with an extremely high accuracy equivalent to the accuracy level of the national voltage standard. Further, the ultra high accuracy and resolution voltage measurement system of the present invention can dramatically improve the measuring accuracy by more than two digits than the conventional technology.

The ultra high accuracy and resolution voltage measurement system of the present invention is capable of measuring the voltage with an extreme high accuracy without being subject to a measuring conditions such as a measuring time, place, or a measuring person. In the second aspect of the present invention wherein the piezo-electric element is used as a standard voltage generator rather than the Josephson junction standard voltage generator, the ultra high accuracy and resolution voltage measurement system of the present invention is available with relatively low cost while maintaining the ability of high measurement accuracy.

DETAILED DESCRIPTION OF THE PREFERRED EMBODIMENTS

The preferred embodiment of the present invention will be explained with reference to the drawings. The first embodiment of the present invention is shown in the block diagram of FIG. 1. In this example, a Josephson junction voltage generator 30 is incorporated in the voltage measurement system as a precision voltage source.

Figure 1:
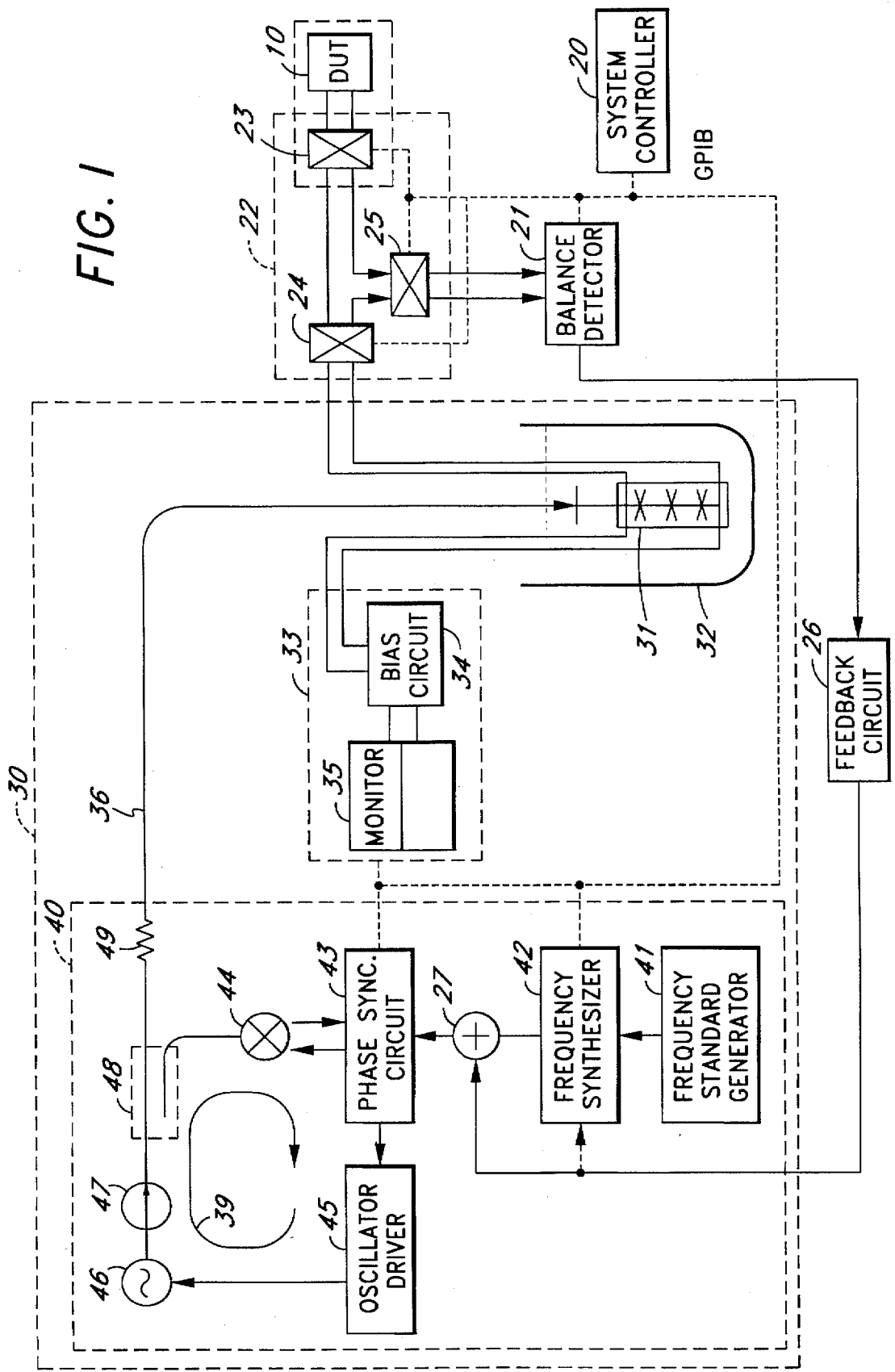
FIG. 1 is a block diagram showing a configuration of the first embodiment of the voltage measurement system according to the present invention.

Before going into the details of FIG. 1, a brief explanation of the first embodiment of the present invention will be made in the following. The output voltage of the Josephson junction is compared with a voltage of the DUT by a balance detector. A correction frequency corresponding to the difference voltage from the balance detector is feedbacked to the Josephson junction voltage generator by controlling a microwave frequency supplied to the Josephson junction. Thus, the output voltage of the Josephson junction voltage generator is controlled to be equal to the voltage of the DUT so that the reading of the Josephson junction voltage generator gives the accurate measurement voltage of the DUT. In FIG. 1, two signal lines are shown in a circuit area associated with high precision analog voltages such as input voltage terminals, the Josephson junction standard voltage generator, and the balance detector to indicate a balanced transmission method (floating lines) as is well known in the art.

In the following, a brief explanation is given as to the Josephson junction voltage generator. As is known in the art, a Josephson junction voltage generator has become to be used as a national voltage standard of each country. By an AC Josephson effect, a voltage Vn which is accurately proportional to a microwave frequency received. This voltage, a Josephson voltage Vn is expressed by the following equation:

$$Vn = N f / K_{J-90}$$

where N is a Josephson step number, f is a microwave frequency (GHz) and $K_{J-90}$ is a Josephson constant and is 483579.9 GHz/V.

Figure 2:
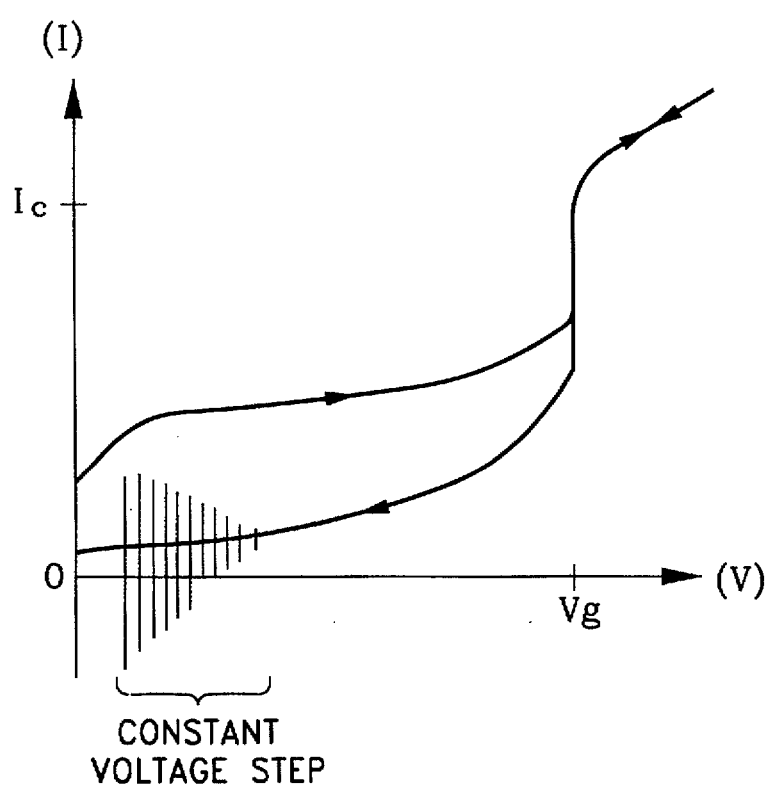
FIG. 2 is a graphic view showing a characteristic curve for explaining an AC Josephson effect to be used in the present invention of FIG. 1.

FIG. 2 further explains the AC Josephson effect. When applying a microwave frequency f to a Josephson element which is in a super conductive state, step voltages having a constant voltage difference are generated. The I-V (current vs. voltage) characteristic curve of the step voltages is expressed in FIG. 2. The constant voltage difference of the step voltages is proportional to the frequency f while the step number N is dependent of a number of Josephson elements included, a microwave power P emitted to the Josephson junction and a bias current for the Josephson junction.

The accuracy of the voltage generated by the Josephson junction is directly dependent upon the accuracy of the microwave frequency. For example, when the low level microwave signal having a frequency of 94 GHz is emitted to the Josephson junction, the resulting constant voltage difference is about 194.4 microvolt. To select the step number N for the desired voltage level from the group of constant voltages, the microwave power P may be first set to a level appropriate to generate the step number N, and then the bias current is adjusted by, for example, an external bias voltage generator.

Thus, the step number N is known by monitoring the bias voltage applied to the Josephson junction and the Josephson voltage Vn is adjusted to be equal to the voltage of the DUT. Thus, by reading the Josephson voltage generated by this process, the accurate voltage of the DUT is obtained. In this measurement, since the voltage resolution of the balance detector is in the range of 10 nV, an averaging process may be incorporated in the measurement when a voltage resolution smaller than 10 nV, such as a 1 nV resolution is required.

Referring back to FIG. 1, a more detailed description is given regarding the present invention. An ultra high accuracy voltage measurement system of the present invention includes a Josephson voltage generator 30 for generating a Josephson voltage, a switch group 22 for changing polarities of signals, a balance detector 21 for detecting a voltage difference, a difference feedback circuit 26 for transmitting a frequency signal proportional to the voltage difference, and a system controller 20. A main feedback loop is formed by the Josephson voltage generator 30, the balance detector 21, and the difference feedback circuit 26 to control the Josephson voltage equal to the voltage to be measured, i.e., the voltage of the DUT 10.

The Josephson voltage generator 30 has a microwave frequency signal generator 40, a voltage generator having a Josephson element 31, and a step number selector 33.

The microwave frequency signal generator 40 generate a microwave frequency f with a microwave power P as described with reference to FIG. 2 to be supplied to the Josephson junction 31. The microwave frequency signal generator 40 is, as a whole, a microwave signal synthesizer to generate a microwave signal of a desired and accurate frequency. Although the frequency range used in this invention may include a millimeter wave range frequency, it is expressed as the microwave signal in this invention. In the present invention, as an example, a microwave frequency of about 94 GHz is used.

The microwave frequency signal generator 40 is formed of a microwave oscillator 46 which is a voltage controlled microwave oscillator, an oscillator driver 45 which generates a drive voltage for the microwave oscillator, a frequency mixer 44 for down convecting the frequency of the microwave oscillator frequency, a phase synchronization circuit 43 which works as a phase comparator, an atomic frequency standard generator 41 for generating a high accuracy reference frequency signal, a frequency synthesizer 42 for generating a frequency based on the reference frequency from the atomic frequency standard generator 41, and a frequency adder 27.

An example of the microwave oscillator 46 is a Gunn oscillator which oscillates around 100 GHz. In this example, the microwave oscillator 46 oscillates at a frequency of 94 GHz with an output power of about 60 mW. The microwave signal from the microwave oscillator 46 passes through an isolator 47, which passes the microwave signal in one direction, a directional coupler 48 which passes the microwave signal in one direction while taking out a part of the microwave signal for the frequency mixer 44, an attenuator 49 for adjusting the power level of the microwave signal, and a waveguide 36 for introducing the microwave signal to the Josephson element 31.

The attenuator 49 is set so that the power level of the microwave signal to the Josephson element roughly matches the step number N for generating a desired Josephson voltage. For the waveguide 36, a dielectric waveguide may be preferable over a metal waveguide since the dielectric waveguide has a less propagation loss.

To generate the microwave signal by the microwave oscillator 46 with a frequency stability of $10^{-10}$ or better, a phase lock loop 39 is formed in the microwave frequency signal generator 40. By this phase lock loop 39, the phase of the microwave signal at the output of the microwave oscillator 46 is locked to the phase of the reference signal generated by the frequency synthesizer 42 whose frequency is synthesized based on the standard frequency of the atomic frequency standard generator 41.

Thus, when the microwave signal is phase-locked, the frequency stability or accuracy of the microwave signal becomes greater than $10^{-10}$ because the atomic frequency standard generator 41 generates an extremely accurate frequency standard. As examples of the atomic frequency standard generator, a cesium atomic standard oscillator or a rubidium atomic standard oscillator are preferable.

In the phase lock loop 39, the directional coupler 48 takes a part of the microwave signal and applies to the frequency mixer 44. The frequency of the microwave signal is down converted by the frequency mixer so that the lower frequency signal, such as 670 MHz, is provided to the phase synchronization circuit 43. The phase synchronization circuit 43 compares the signal from the frequency mixer 44 and the reference signal from the frequency synthesizer 42 which is originated from the atomic frequency standard generator 41.

The phase synchronization circuit 43 generates a difference signal which is a voltage signal proportional to the phase difference between the two signals. The difference signal is applied to the oscillator driver 45 which drives the microwave oscillator by the voltage about 10 volts. Although not shown, a loop amplifier and a low pass filter may be provided between the phase synchronization circuit 43 and the oscillator driver 45 for adjusting the loop gain and the phase characteristics of the phase lock loop 39.

The output frequency of the frequency synthesizer 42 is varied by a frequency signal provided from the difference feedback circuit 26. An example of the difference feedback circuit 26 is a voltage-frequency converter. When the difference feedback circuit 26 receives a voltage difference from the balance detector 21, it generates a signal having a frequency proportional to the voltage difference and able to cancel the voltage difference.

The frequency signal from the feedback circuit 26 is applied to the frequency adder 27 wherein it is added to or subtracted from the output frequency of the frequency synthesizer 42. The frequency adder 27 may be formed of a frequency mixer and a frequency filter. The frequency adder 27 mixes the frequency signals from the frequency synthesizer 42 and the difference feedback circuit 26 and outputs a frequency equal to their difference and/or sum of the frequency.

Another example of the difference feedback circuit 26 is an analog-digital converter. The analog-digital converter 26 converts the voltage difference into a corresponding digital signal. The digital signal indicating a frequency which can cancel the voltage difference is applied to the frequency synthesizer 42 wherein the synthesizer frequency is modified by the amount indicated by the digital signal. In this arrangement, the output of the frequency synthesizer 42 can be directly supplied to the phase synchronization circuit 43 and thus the frequency adder 27 is unnecessary.

When the difference feedback circuit 26 is an analog-voltage converter as above, it is also possible to generate the controlled frequency by the frequency synthesizer 42 with the use of the system controller 20. The system controller 20 obtains a frequency to cancel the voltage difference in the balance detector and send a command to the frequency synthesizer to generate a modified frequency. As in the above example, in this arrangement, the output of the frequency synthesizer 42 can be directly supplied to the phase synchronization circuit 43 and the frequency adder 27 is unnecessary.

Other arrangement may also be possible so long as the reference frequency to be supplied to the phase synchronization circuit 43 is controlled in a negative feed back loop to eliminate the voltage difference between the Josephson voltage generator 30 and the voltage of the DUT to be measured detected by the balance detector 21.

The voltage generator is formed of the Josephson element 31 soaked in liquid helium (He) in the liquid helium container 32. When niobium (Nb) is used as a super conductive material of the Josephson element, since the Curie temperature Tc of niobium is 8.6K, the niobium turned to the super conductive state at the liquid helium temperature which is 4.2K.

Various types of the Josephson junction may be used in this invention. One of the preferred embodiments of the Josephson element is an array of 20,000 junctions connected in series and receives the microwave signal through the waveguide. The Josephson junction has a fin line antenna to receive the microwave signal in a waveguide transmission mode and converts it to a strip-line transmission mode. The more detail of this structure and performance is described in the Japanese Patent Serial No. 5-250408 filed by the same applicant of the present invention.

The step number selector 33 is formed of a bias circuit 34 which supplies a bias current to the Josephson junction 31, and a monitor 35 to monitor the voltage and current of the bias circuit 34. The step number N of the Josephson standard voltage is roughly determined by the microwave power supplied to the Josephson junction. The precise step number is determined by the bias current. The bias current circuit is basically a current source having a large output impedance to generate a constant current. By monitoring and controlling the voltage and current of the bias circuit, the accurate step number N of the Josephson voltage generator can be set and known by the reading of the voltage and current.

The switch group 22 is formed of a DUT switch 23 which receives an input voltage to be measured from the DUT, a standard switch 24 which receives the Josephson voltage generated by the Josephson element 31, and a balance detection switch 25 which receives both the DUT voltage and the standard voltage. Each of the switches is controlled by the system controller 20 so that the polarity of the voltage is alternately changed.

For example, in the DUT switch 23, assuming that one terminal (a) of the switch 23 is connected to the high voltage of the DUT voltage and the other terminal (b) is connected to the low voltage (ground) of the DUT voltage. In the next cycle, the polarity of the voltage is reversed, so that the terminal (a) is connected to the low voltage and the terminal (b) is connected to the high voltage of the DUT voltage. Such switching for alternately changing the polarity of the receiving voltage is repeated in the constant period of time, such as every 100 millisecond in every switch in the switch group 22.

The switching of the polarity as noted above is necessary to cancel the offset voltages caused by a thermo-electric power and a leakage current. For example, the conductor materials such as cables of the DUT and the voltage measurement system are not always the same. The conductive materials within the measurement system such as the cable from the Josephson junction 31 and the terminals in the switch group 22 may be different. When different type of metals are connected, a thermo-electric voltage is produced which is not the true voltage of the DUT or the standard voltage. By changing the polarity of the receiving voltage, the thermo-electric voltage is canceled out while the two receiving voltages are added.

Further, when a leakage current exists in the measurement system, such a leakage current will produce a voltage drop. For example, the leakage current may flow between input terminals of the measurement system since the input impedance is not infinite. Thus, by the product of a resistance component of the input impedance and the leakage current, an offset voltage is produced which is not the true voltage of the DUT or the standard voltage.

By changing the polarity of the receiving voltage, the thermo-electric voltage is canceled out while the two receiving voltages are added. For example, when the leakage current is $I_L$, and the input resistance and a = resistance in an input filter (not shown) are $R_I$ and $R_F$, respectively, the input voltage at the switch 23 when switching the polarity is:

$$V_+ = I_L(R_F + R_I) + E$$

$$V_- = I_L(R_F + R_I) - E$$

where E is a true voltage of the DUT. Then the true voltage E is obtained by:

$$E = (V_+ - V_-)/2$$

Therefore, by alternately changing the polarity of the switch group 22, the offset voltages caused by the thermo-electric power or the leakage current are canceled by the foregoing procedure. In the example of FIG. 1, since the Josephson element is provided with a bias current, the same effect can be obtained by changing the polarity of the bias current to the Josephson element. Thus, in such a case, the switch 24 can be eliminated.

An example of the balance detector 21 is a bridge circuit or a differential amplifier to detect the voltage difference between the DUT voltage and the standard voltage in an analog form. Preferably, one of the highest end digital voltmeters available in the market is used for this balance detector. Such a digital voltmeter has a voltage resolution of 10 nV and has two input terminals and one common ground terminal.

The DUT voltage and the standard voltage are connected to the two input terminals, respectively, while the other input terminals are connected to the common ground terminal of the digital voltmeter. The digital voltmeter measures the difference voltage with 10 nV resolution and the difference data indicating the frequency to be compensated is transferred to the frequency synthesizer 42 as noted above. It should be noted that although the digital voltmeter such as this one has a voltage resolution of 10 nV, the measurement accuracy or the traceability to the national standard is in the range of 3 microvolt when expressed by seven-and-half digits (200 mV full scale, for example).

The difference feedback circuit 26 is to convert the analog voltage from the balance detector indicating the voltage difference between the DUT voltage and the standard voltage to a corresponding frequency signal. As described above, with reference to the frequency synthesizer 42, the frequency signal is added or subtracted from the frequency generated by the frequency synthesizer 42 to cancel the voltage difference by the main feedback loop. Thus, the difference feedback circuit 26 in this situation is a voltage-frequency converter.

As mentioned above, in case where the analog-digital converter is used as the difference feedback circuit 26, digital data from the analog-digital converter directly controls the output frequency of the frequency synthesizer 42 to decrease the voltage difference between the DUT voltage and the standard voltage. Further, in case where the digital voltmeter is used as the balance detector as in the above example, the output of the digital voltmeter may be directly supplied to the frequency synthesizer 42 to control its frequency without using the difference feedback circuit 26.

The system controller 20 controls an overall process of the measurement system. For example, by controlling the polarity changes of the switch group 22, it determines the detection timing in the balance detector 21. The system controller 20 also determines various parameters such as an output frequency of the frequency synthesizer 42, the bias current and voltage of the bias circuit 33 in the step number selector 33. Thus, the system controller determines all of the operations and timings of the voltage measurement system.

Figure 3:
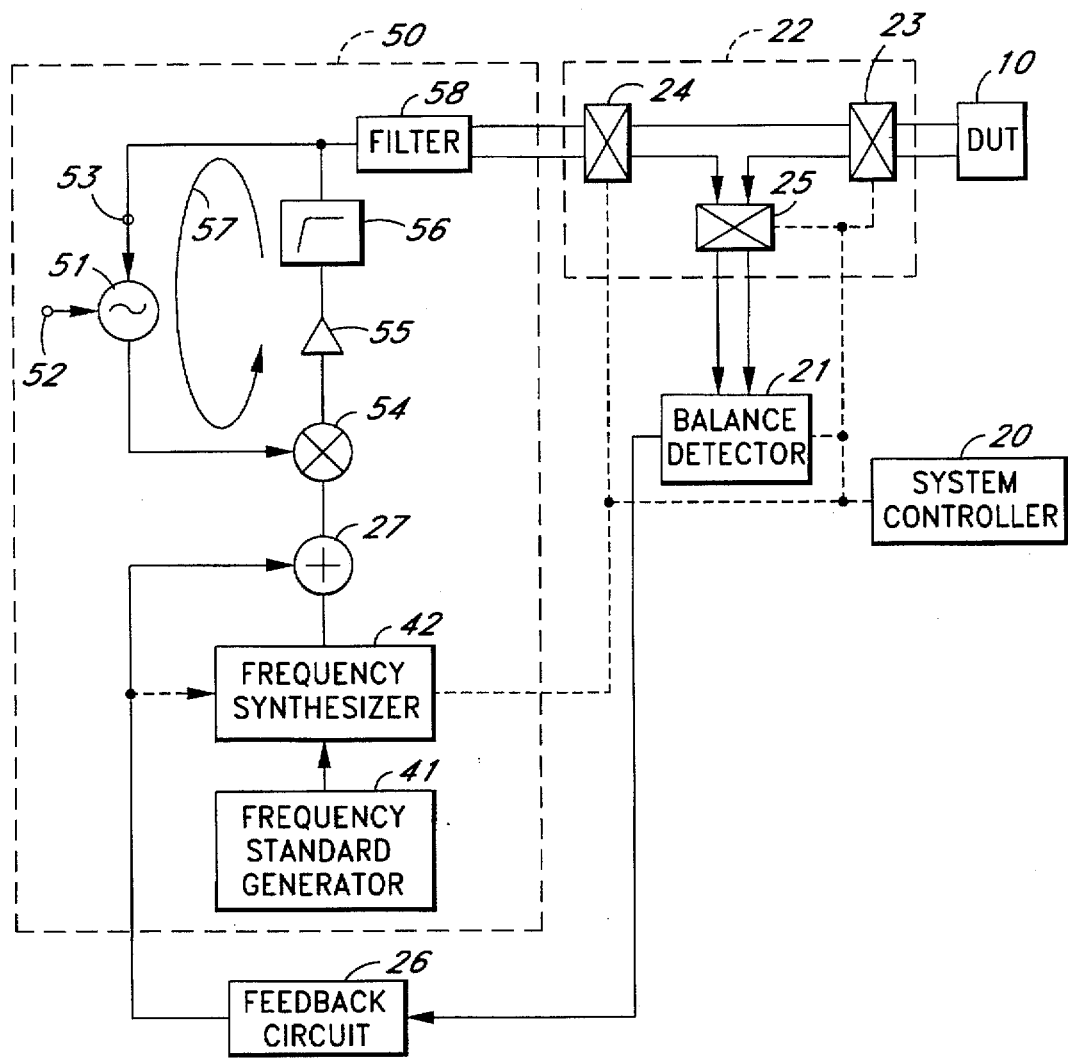
FIG. 3 is a block diagram showing a configuration of the second embodiment of the voltage measurement system according to the present invention.
Figure 4:
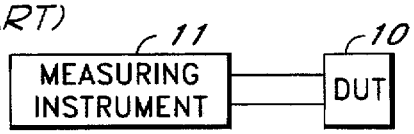
FIG. 4 is a block diagram showing a configuration of voltage measurement in the conventional arrangement.

FIG. 3 shows a second embodiment of the present invention. Since the Josephson junction voltage generator employed in the first embodiment is a expensive device, in the second aspect of the present invention, a frequency controlled voltage generator, which is available with a relatively low cost, is used as a precision voltage source. The frequency controlled voltage generator uses a resonator made of a piezo-electric element. Similar to the first aspect of the present invention, the frequency controlled voltage generator is controlled its frequency so that the output voltage becomes equal to the voltage of the DUT. Thus, the reading of the control voltage supplied to the frequency controlled voltage generator gives the accurate measurement voltage of the DUT.

In FIG. 3, as noted above, a frequency controlled voltage generator 50 is used instead of the Josephson voltage generator 30 of FIG. 1. Although the measurement accuracy of the embodiment of FIG. 3 is lower than the embodiment of FIG. 1, the measurement system of FIG. 3 can be formed at considerably low cost. In FIG. 3, two signal lines are shown in a circuit area associated with high precision analog voltages such as input voltage terminals, the frequency controlled voltage generator, and the balance detector to indicate the balanced transmission method (floating lines) similar to FIG. 1.

A high accuracy voltage measurement system of the present invention includes a frequency controlled voltage generator 50 for generating a standard voltage, a switch group 22 for changing polarities of signals, a balance detector 21 for detecting a voltage difference, a difference feedback circuit 26 for transmitting a frequency signal proportional to the voltage difference, and a system controller 20. A main feedback loop is formed by the frequency controlled voltage generator 50, the balance detector 21, and the difference feedback circuit 26 to control the standard voltage equal to the voltage to be measured, i.e., voltage of the DUT 10.

The principle of operation in the voltage measurement system of FIG. 3 is the same as the system of FIG. 1 except for the Josephson voltage generator 30 is replaced with the frequency controlled voltage generator 50. Therefore, the frequency controlled voltage generator 50 will be explained in detail in the following.

The frequency controlled voltage generator 50 incudes a voltage controlled oscillator 51 the frequency of which is controlled by a voltage and having a voltage terminal 52, a phase comparator 54 to compare phases of two signals and generate a voltage representing the phase difference, a loop amplifier 55 and a loop filter 56, a filter 58 for smoothing the control voltage.

As in the example of FIG. 1, the frequency controlled voltage generator 50 further includes a frequency adder 27, a frequency synthesizer 42 and an atomic frequency standard generator 41. A phase lock loop 57 is formed of the phase comparator 54, the voltage controlled oscillator 51, the loop filter 56 and the loop amplifier 55.

The voltage controlled oscillator 51 is typically a single crystal piezo-electric element made for example of lithium tantalate (LiTaO$_3$). Other piezo-electric crystal may also be applicable to the voltage controlled oscillator 51. Further, a voltage tuned oscillator made for example of YIG (yttrium iron garnet) is also applicable. In the example of FIG. 3, the piezo-electric crystal made of lithium tantalate (LiTaO$_3$) is used in the voltage controlled oscillator 51. The voltage controlled oscillator oscillates at the frequency range of 4–30 MHz with the control voltage of 0–6 V. The more detail of the voltage controlled oscillator using the lithium tantalate piezo-electric element is given in the Japanese Application Serial No. 4-233178 filed by the same applicant.

The voltage controlled oscillator 51 oscillates when the voltage is supplied to the voltage terminal 52. The voltage at the terminal 52 is a fixed voltage to determine the center frequency of the voltage controlled oscillator 51. The voltage controlled oscillator 51 is also controlled its frequency by the voltage given at a terminal 53 provided from the phase comparator 54 through the loop amplifier 55 and the loop filter 56. The voltage at the terminal 53 fine controls the frequency of the voltage controlled oscillator 51.

The phase lock loop 57 controls the frequency of the voltage controlled frequency oscillator 51 to be equal to a reference frequency from the frequency synthesizer 42. The frequency synthesizer 42 receives a standard frequency signal generated by the atomic frequency standard generator 41. The standard frequency signal has the frequency stability which is $10^{-11}$ or better. The frequency synthesizer 42 synthesizes various frequency signals such as 10 MHz signal having a frequency accuracy of $10^{-10}$–$10^{-11}$ utilizing this standard frequency signal.

The phase comparator 54 compares the reference signal from the frequency synthesizer 42 and the output of the voltage controlled oscillator 51 and generates a voltage representing the phase difference between the two. The difference voltage is feedbacked to the terminal 53 through the loop amplifier 55 and the loop filter 56 to change the frequency of the oscillator 51 so that the phase difference becomes zero. The loop amplifier 55 and the loop filter 56 determine the phase lock loop response characteristics. Thus, by this phase lock loop 57, the phase at the output of the voltage controlled oscillator 51 is locked to the phase of the reference signal generated by the frequency synthesizer 42.

Thus, when the voltage controlled oscillator 51 is phase-locked, the frequency stability or accuracy of the output of the oscillator 51 becomes greater than $10^{-10}$ because the reference signal from the frequency synthesizer 42 is made of the frequency standard from the atomic frequency standard generator 41 as noted above. In the example of FIG. 3, the control voltage at the terminal 53 is used as the standard voltage to compare with the input voltage from the DUT 10 to be measured.

Similar to the example of FIG. 1, the standard voltage, which is in this case an output voltage from the filter 58, and the voltage of the DUT is compared and the difference is controlled to be canceled by the main feedback loop. Thus, the output frequency of the frequency synthesizer 42 is varied by a frequency signal provided from the difference feedback circuit 26. An example of the difference feedback circuit 26 is a voltage-frequency converter. When the difference feedback circuit 26 receives a voltage difference from the balance detector 21, it generates a signal having a frequency proportional to the voltage difference to cancel the voltage difference.

The frequency signal from the feedback circuit 26 is applied to the frequency adder 27 wherein it is added to or subtracted from the output frequency of the frequency synthesizer 42. Alternatively, as described with reference to FIG. 1, the analog-digital converter is preferably used for the difference feedback circuit 26. The analog-digital converter 26 converts the voltage difference into a corresponding digital signal. In the further alternative, the system controller obtains the digital signal corresponding to the voltage difference.

The digital signal indicating a frequency which can cancel the voltage difference is applied to the frequency synthesizer 42 wherein the synthesizer frequency is modified by the amount indicated by the digital signal. In these arrangements of using the analog-digital converter or the system controller to control the frequency synthesizer 42, the output of the frequency synthesizer 42 can be directly supplied to the phase synchronization circuit 43 and thus the frequency adder 27 is unnecessary.

By controlling the output frequency of the frequency synthesizer 42 in the main feedback loop, the standard voltage generated by the frequency controlled voltage generator 50 is controlled to be equal to the input voltage to be measured. By reading the frequency of the voltage controlled oscillator 51, the accurate voltage of the frequency controlled voltage generator 50, and thus, the voltage of the DUT is known.

Unlike the Josephson junction, the frequency-voltage characteristics of the piezo-electric element is not fixed but varies from element to element. Further, such frequency-voltage relationship is not always linear. Therefore, it is preferable to store the data indicating the frequency-voltage relationship in a memory, for example, in the system controller 20 to calculate the voltage amount corresponding to the frequency of the oscillator 51 controlled by the main feedback loop. Such data to be stored in the memory is preferably measured by the ultra high accuracy voltage measurement system of FIG. 1.

As in the foregoing, according to the present invention, the ultra high accuracy and resolution voltage measurement system is capable of measuring the voltage with an extremely high accuracy equivalent to the accuracy level of the national voltage standard. Further, the ultra high accuracy and resolution voltage measurement system of the present invention can dramatically improve the measuring accuracy by more than two digits than the conventional technology.

The ultra high accuracy and resolution voltage measurement system of the present invention is capable of measuring the voltage with an extreme high accuracy without being subject to a measuring conditions such as a measuring place, time or a measuring person. In the second aspect of the present invention wherein the piezo-electric element is used as a standard voltage generator rather than the Josephson junction standard voltage generator, the ultra high accuracy and resolution voltage measurement system of the present invention is available with relatively low cost while maintaining the ability of high measurement accuracy.

What is claimed is:

1. A high accuracy voltage measurement system for measuring an input voltage, comprising:

a microwave oscillator which generates a microwave signal wherein the frequency of said microwave signal is variable by a voltage applied thereto;

an atomic frequency standard which generates a standard frequency signal with extremely high accuracy and stability;

a frequency synthesizer which synthesizes a frequency signal based on said standard frequency signal from said atomic frequency standard;

a phase lock loop for synchronizing a phase of said microwave signal with a phase of said frequency signal from said frequency synthesizer;

a Josephson junction voltage generator which is soaked with liquid helium and generates a standard voltage determined by said frequency and a power level of said microwave signal generated by said microwave oscillator;

a bias circuit for supplying a bias current to said Josephson junction voltage generator;

a switch group provided between said Josephson junction voltage generator and said input voltage to be measured for alternately changing polarities of said input voltage to be measured and said standard voltage generated by said Josephson junction voltage generator;

a balance detector connected to said switch group for detecting a voltage difference between said input voltage and said standard voltage; and a feedback circuit connected to said balance detector to feedback a frequency to be added to or subtracted from said frequency signal generated by said frequency synthesizer to control said frequency of said microwave signal through said phase lock loop so that said voltage difference between said input voltage and said standard voltage is canceled.

2. A high accuracy voltage measurement system as defined in claim 1, wherein said Josephson junction voltage generator generates said standard voltage which is proportional to said frequency of said microwave signal and a step number N, wherein said step number N being determined by a number of junctions provided in said Josephson junction and said power level of said microwave signal and said bias current.

3. A high accuracy voltage measurement system as defined in claim 1, wherein said Josephson junction voltage generator receives said microwave signal from said microwave oscillator through a waveguide and a strip line antenna, and said Josephson junction is formed of an array of about 20,000 junctions.

4. A high accuracy voltage measurement system as defined in claim 1, wherein said Josephson junction voltage generator includes niobium (Nb) as a super conductive material which is in a super conductive state when soaked with said helium liquid.

5. A high accuracy voltage measurement system as defined in claim 1, wherein said balance detector is a signal bridge or a differential amplifier and said feedback circuit is a voltage-frequency converter which converts said voltage difference to a frequency to be applied to said phase lock loop to control said frequency of said microwave signal.

6. A high accuracy voltage measurement system as defined in claim 1, wherein said balance detector and said feedback circuit are formed with a digital voltmeter which receives both said standard voltage and said input voltage and produces a digital signal corresponding to said difference voltage, said digital signal being received by said frequency synthesizer to change a frequency of said frequency signal given to said phase lock loop to control said frequency of said microwave signal.

7. A high accuracy voltage measurement system as defined in claim 1, wherein said phase lock loop includes a drive circuit which provides a drive voltage to said microwave oscillator, a frequency mixer which down converts said frequency of said microwave signal, a phase synchronization circuit which compares phases of said frequency signal from said frequency synthesizer and a down converted signal from said frequency mixer and controls said drive voltage of said drive circuit to synchronize said phases.

8. A high accuracy voltage measurement system as defined in claim 1, wherein said bias circuit includes a monitor circuit to monitor a voltage and said bias current supplied to said Josephson junction voltage generator.

9. A high accuracy voltage measurement system as defined in claim 1, wherein said microwave oscillator is a Gunn oscillator and said microwave signal is transmitted to said Josephson junction voltage generator through a directional coupler and an attenuator.

10. A high accuracy voltage measurement system as defined in claim 1, wherein said feedback circuit is an analog-digital converter which converts said voltage difference to a digital signal corresponding to said difference voltage, said digital signal being received by said frequency synthesizer to change a frequency of said frequency signal given to said phase lock loop to control said frequency of said microwave signal.

11. A high accuracy voltage measurement system as defined in claim 5, wherein said frequency produced by said voltage-frequency converter to be applied to said phase lock loop to control said frequency of said microwave signal is provided to a frequency adder wherein combined with said signal frequency from said frequency synthesizer.

12. A high accuracy voltage measurement system as defined in claim 1, wherein said switch group changes said polarities of said input voltage and said standard voltage to cancel error voltages caused by a thermo-electric power and a leakage current.

13. A high accuracy voltage measurement system as defined in claim 1, wherein said atomic frequency standard is a cesium atomic frequency standard or a rubidium atomic frequency standard.

14. A high accuracy voltage measurement system for measuring an input voltage, comprising:

a voltage controlled oscillator which has a piezo-electric element as a resonator and generates a high frequency signal the frequency of which is variable by a voltage applied thereto;

an atomic frequency standard which generates a standard frequency signal with extremely high accuracy and stability;

a frequency synthesizer which synthesizes a frequency signal based on said standard frequency signal from said atomic frequency standard;

a phase lock loop for synchronizing a phase of said high frequency signal from said voltage controlled oscillator with a phase of said frequency signal from said frequency synthesizer;

a switch group provided between said phase lock loop and said input voltage to be measured for alternately changing polarities of said input voltage to be measured and a standard voltage generated by said phase lock loop;

a balance detector connected to said switch group for detecting a voltage difference between said input voltage and said standard voltage; and a feedback circuit connected to said balance detector to feedback a frequency to be added to or subtracted from said frequency signal generated by said frequency synthesizer to control said frequency of said high frequency signal through said phase lock loop so that said voltage difference between said input voltage and said standard voltage is canceled.

15. A high accuracy voltage measurement system as defined in claim 14, wherein said balance detector is a signal bridge or a differential amplifier and said feedback circuit is a voltage-frequency converter which converts said voltage difference to a frequency to be applied to said phase lock loop to control said frequency of said high frequency signal.

16. A high accuracy voltage measurement system as defined in claim 14, wherein said balance detector and said feedback circuit are formed with a digital voltmeter which receives both said standard voltage and said input voltage and produces a digital signal corresponding to said difference voltage, said digital signal being received by said frequency synthesizer to change a frequency of said frequency signal given to said phase lock loop to control said frequency of said high frequency signal.

17. A high accuracy voltage measurement system as defined in claim 14, wherein said phase lock loop includes a drive circuit which includes a loop amplifier and a loop filter and provides a drive voltage to said voltage controlled oscillator, a phase comparator which compares phases of said frequency signal from said frequency synthesizer and said high frequency signal from said voltage controlled oscillator and controls said drive voltage of said drive circuit to synchronize said phases.

18. A high accuracy voltage measurement system as defined in claim 14, wherein said feedback circuit is an analog-digital converter which converts said voltage difference to a digital signal corresponding to said difference voltage, said digital signal being received by said frequency synthesizer to change a frequency of said frequency signal given to said phase lock loop to control said frequency of said high frequency signal.

19. A high accuracy voltage measurement system as defined in claim 15, wherein said frequency produced by said voltage-frequency converter to be applied to said phase-lock loop to control said frequency of said high frequency signal is provided to a frequency adder wherein combined with said signal frequency from said frequency synthesizer.

20. A high accuracy voltage measurement system as defined in claim 14, wherein said switch group changes said polarities of said input voltage and said standard voltage to cancel error voltages caused by a thermo-electric power and a leakage current.

21. A high accuracy voltage measurement system as defined in claim 14, wherein said atomic frequency standard is a cesium atomic frequency standard or a rubidium atomic frequency standard.

22. A high accuracy voltage measurement system for measuring an input voltage, comprising:

a microwave oscillator which generates a microwave signal whose frequency is variable by a voltage applied thereto;

a frequency standard generator which generates a standard frequency signal;

a frequency synthesizer which synthesizes a frequency signal based on said standard frequency signal;

a phase lock loop for synchronizing a phase of said microwave signal with a phase of said frequency signal from said frequency synthesizer;

a Josephson junction voltage generator which generates a standard voltage determined by said microwave signal generated by said microwave oscillator;

a balance detector for detecting a voltage difference between said input voltage and said standard voltage from said Josephson junction voltage generator; and a feedback circuit connected to said balance detector to feedback a frequency to be combined with said frequency signal generated by said frequency synthesizer to control said frequency of said microwave signal through said phase lock loop.

23. A high accuracy voltage measurement system for measuring an input voltage, comprising:

a voltage controlled oscillator which generates a high frequency signal whose frequency is variable by a voltage applied thereto;

a frequency standard which generates a standard frequency signal;

a frequency synthesizer which synthesizes a frequency signal based on said standard frequency signal;

a phase lock loop for synchronizing a phase of said high frequency signal from said voltage controlled oscillator with a phase of said frequency signal from said frequency synthesizer;

a balance detector for detecting a voltage difference between said input voltage and a standard voltage received from said phase lock loop; and a feedback circuit connected to said balance detector to feedback a frequency to be added to or subtracted from said frequency signal generated by said frequency synthesizer to control said frequency of said high frequency signal through said phase lock loop.

* * * * *